United States Patent
Kushnarenko

(10) Patent No.: US 7,864,606 B2
(45) Date of Patent: Jan. 4, 2011

(54) METHOD, DEVICE AND SYSTEM FOR REGULATING ACCESS TO AN INTEGRATED CIRCUIT (IC) DEVICE

(75) Inventor: Alexander Kushnarenko, Haifa (IL)

(73) Assignee: Spansion Israel Ltd, Netanya (IE)

( * ) Notice: Subject to any disclaimer, the term of this patent is extended or adjusted under 35 U.S.C. 154(b) by 218 days.

(21) Appl. No.: 12/232,495

(22) Filed: Sep. 18, 2008

(65) Prior Publication Data

US 2009/0097345 A1 Apr. 16, 2009

Related U.S. Application Data

(60) Provisional application No. 60/973,189, filed on Sep. 18, 2007.

(51) Int. Cl.
*G11C 29/00* (2006.01)

(52) U.S. Cl. .......... 365/201; 365/191; 365/194; 365/189.12; 365/230.03

(58) Field of Classification Search ............ 365/201, 365/191, 194, 230.03, 189.12
See application file for complete search history.

(56) References Cited

U.S. PATENT DOCUMENTS

| | | | |
|---|---|---|---|
| 4,701,843 A * | 10/1987 | Cohen | 711/105 |
| 6,992,932 B2 | 1/2006 | Cohen | |
| 2008/0151622 A1 * | 6/2008 | Qawami et al. | 365/185.05 |
| 2009/0037645 A1 * | 2/2009 | Hsieh | 711/103 |
| 2009/0106571 A1 * | 4/2009 | Low et al. | 713/310 |

OTHER PUBLICATIONS

"A Mathematical Theory of Communication" The Bell System Technical Journal vol. 27 pp. 379-423, 623-656, July, Oct. 1948.

* cited by examiner

*Primary Examiner*—Pho M Luu
(74) *Attorney, Agent, or Firm*—Eitan Mehulal Law Group

(57) ABSTRACT

A circuit block access module (ICAM) residing on an integrated circuit and adapted to access a circuit block on the integrated circuit, the module comprising control logic adapted to extract data from a serial data line into two or more parallel data lines, wherein at least one of the parallel data lines is associated with a circuit block address line; and the control logic is further adapted to override or bypass at least a portion of a primary control circuit of said integrated circuit.

27 Claims, 6 Drawing Sheets

METHOD, DEVICE AND SYSTEM FOR REGULATING ACCESS TO AN INTEGRATED CIRCUIT (IC) DEVICE

CROSS-REFERENCE(S) TO RELATED APPLICATION(S)

This application claims the benefit of U.S. Provisional Application No. 60/973,189, filed 18 Sep. 2007, the entire disclosure of which is incorporated herein by reference.

FIELD OF THE INVENTION

The present invention relates generally to the field of semiconductors. More specifically, the present invention relates to integrated circuit devices, including non-volatile memory (NVM) devices.

BACKGROUND

Testability in integrated circuit devices (ICs) generally refers to an ability of test equipment (TE), usually externally connected to an IC, to access circuit blocks within the IC for testing and debugging (troubleshooting) purposes. Typically, during a testing or debugging process, the TE, which may be connected to the IC through an IC input/output (I/O) interface, and more frequently through test pins on the IC, access one or more circuit blocks by overriding or bypassing control circuitry in the IC. Once the circuit block is accessed, the TE connects to the block, occasionally bypassing other blocks in the IC, and may perform functions which may include configuring, initializing, triggering, and/or operating the circuit block. Optionally, the TE may be connected to a connector of a printed circuit board (PCB), or of an electronic module, comprising a plurality of ICs, the TE adapted to test the circuit blocks in each IC.

JTAG, or Joint Test Action Group, was an industry group formed in the mid-1980's to examine problems associated with testing printed circuit boards (PCBs) due to limited access to circuit blocks inside the PCB. JTAG was also responsible to propose solutions for solving the limited access problem. The solution was first documented in 1990 as an industry standard of the Institute of Electrical and Electronic Engineers, IEEE 1149.1-1990 Standard Test Access Port and Boundary Scan Architecture. Since then this standard, either in the original form and/or in any, or all, of the revised updated forms, has been adopted by many IC manufacturers, the architecture described therein frequently used as a primary means to access circuit blocks in ICs.

The IEEE 1149.1 boundary scan architecture is based on connecting a memory cell to every signal input and every signal output inside a device, and serially connecting the memory cells together to form a parallel-in, parallel-out shift register. Data from the TE is input to the IC through a pin on the device generally identified as Test Data In (TDI), and is shifted from memory cell to memory cell until reaching a second pin on the device, Test Data Out (TDO), through which the data is output back to the TE. Optionally, the data from TDO may be used as an input to the TDI of a second IC. The TE may then compare the data input with the data output. A clock signal from the TE is provided through a third pin on the device, Test Clock (TCK). Modes of operation of the circuit block are provided by the TE through a fourth pin on the device, Test Mode Select (TMS). An optional fifth pin on the device, Test Reset (TRST) may be used to connect the TE for resetting a Test Access Port (TAP) controller in the device.

More information on the boundary scan architecture may be found in IEEE 1149.1-2001, incorporated herein by reference in its entirety.

SUMMARY OF THE INVENTION

According to some embodiments of the present invention, there may be provided a circuit block access module (ICAM) residing on an integrated circuit and adapted to access a circuit block on the integrated circuit. The ICAM may include control logic adapted to extract data from a serial data line into two or more parallel data lines, wherein at least one of the parallel data lines may be associated with a circuit block address line of the IC. The control logic may further be adapted to override or bypass at least a portion of a primary control circuit, for example, a controller of the integrated circuit. Thus, the ICAM may be adapted to activate or deactivate a circuit block. The ICAM may be adapted to connect or disconnect a circuit block to or from a data line of the IC. The ICAM may be connected or otherwise functionally associated with one or more pins through which the serial data may be input to the integrated circuit.

The present invention is a method, device and system for regulating access to circuit blocks in an IC device. Optionally, the IC may be a non-volatile memory (NVM) device.

According to some embodiments of the present invention, there may be provided a circuit block access module (ICAM) residing on an integrated circuit. The ICAM may include control logic with at least one input terminal (single pin), which input terminal may be a serial data line used to serially provide command (control) and data signals to the ICAM. The ICAM may extract data from the serial data line into two or more parallel data lines, wherein at least one of the parallel data lines is associated with a circuit block address line. For convenience hereinafter, the circuit block may also be referred to as "block". The ICAM, or its control logic, may override, or optionally bypass, at least a portion of the IC device's primary control circuitry (controller), and may cause commands received over the serial data line to be executed. Optionally, the ICAM may reside externally to the IC, and the circuit blocks may be comprised in a plurality of ICs.

According to some embodiments of the present invention, the serial data line may comprise one or more short and long pulses. The short pulses may include information associated with the block address line which is to be accessed. The long pulses may serve to enable and disable a decoder comprised in the ICAM, the decoder adapted to convert the short pulses into address calls to the blocks. In some embodiments of the invention, a general format for the serial data may include a first long pulse, followed by a series of short pulses of pulse width Tp1 and temporally spaced Tp0 apart, and a second long pulse. First long pulse and second long pulse may be of a same, or optionally different, pulse width. Depending on the address call, the second long pulse may be followed by a series, or optionally a plurality of one or more different series, of short pulses followed by a long pulse. Optionally, some or all of the long pulses may include the information associated with the block address, and some or all of the short pulses may be adapted to enable and disable the decoder.

In an embodiment of the invention, the ICAM comprises an N-bit counter and an N-bit register. The N-bit counter is adapted to count a leading edge of the short pulses, and the N-bit register is adapted to store the pulse count as binary data. Optionally, the decoder may be adapted to count a trailing edge of the short pulses. Optionally, the decoder may be adapted to count the leading edge, or the trailing edge, of the long pulses. The binary data may be associated with the block address line of the one or more blocks to be accessed.

In a normal mode of memory operation, no signal is applied to the input terminal, and the ICAM is disabled; all outputs of the counter and the register are switched off. Applying serial data to the input terminal enables the ICAM. The serial data is transferred to an input of the counter, and is transferred substantially in parallel to a first delay circuit, and to a second delay circuit. The first delay circuit is adapted to enable the counter when Tp0<T1, where T1 is a predetermined serial data transition time. The second delay circuit is adapted to activate a first pulse generator when Tp1<T2, where T2 is a predetermined serial data accomplishment period. The first pulse generator is adapted to enable the register, and is further adapted to activate a second pulse generator, the second pulse generator adapted to generate a counter reset signal.

In some embodiments of the invention, the ICAM comprises a buffer connected to the input of the serial data line. The buffer, which may be adapted to provide protection to electrostatic discharge (ESD) and to filter noise, and which may be further adapted to balance loading between an external signal source and the ICAM, may introduce a propagation delay T3 to the serial data line. The serial data transition time, T1, in the first delay circuit, may be given by T1>Tp0>T3. The serial data transition time, T2, in the second delay circuit, may be given by T2>Tp1>T3.

In some embodiments of the invention, the serial data line may be generated by an external TE adapted to access the blocks. Data may then be read from the blocks by the TE through the IC input/output (I/O) interface. Optionally, the IC comprises a dedicated output pin to which the TE may be connected to read the data output from the blocks. Optionally, the controller, responsive to the binary data, accesses the blocks.

In some embodiments of the invention, the IC may comprise a built-in self test (BIST) control logic. The BIST control logic may be adapted to compare the data read from the block with a predetermined data. Responsive to the comparison, the BIST control logic may send information associated with the comparison to the TE.

In some embodiments of the invention, the IC including the ICAM, may be comprised in equipment used in communication systems, medical systems, transportation systems, computer systems, consumer electronic systems, power transmission systems, and/or other systems comprising the use of ICs. Some of this equipment may include, for example; desktop computers and workstations, portable computers, mobile telephones, avionics, and medical imaging equipment, among others.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
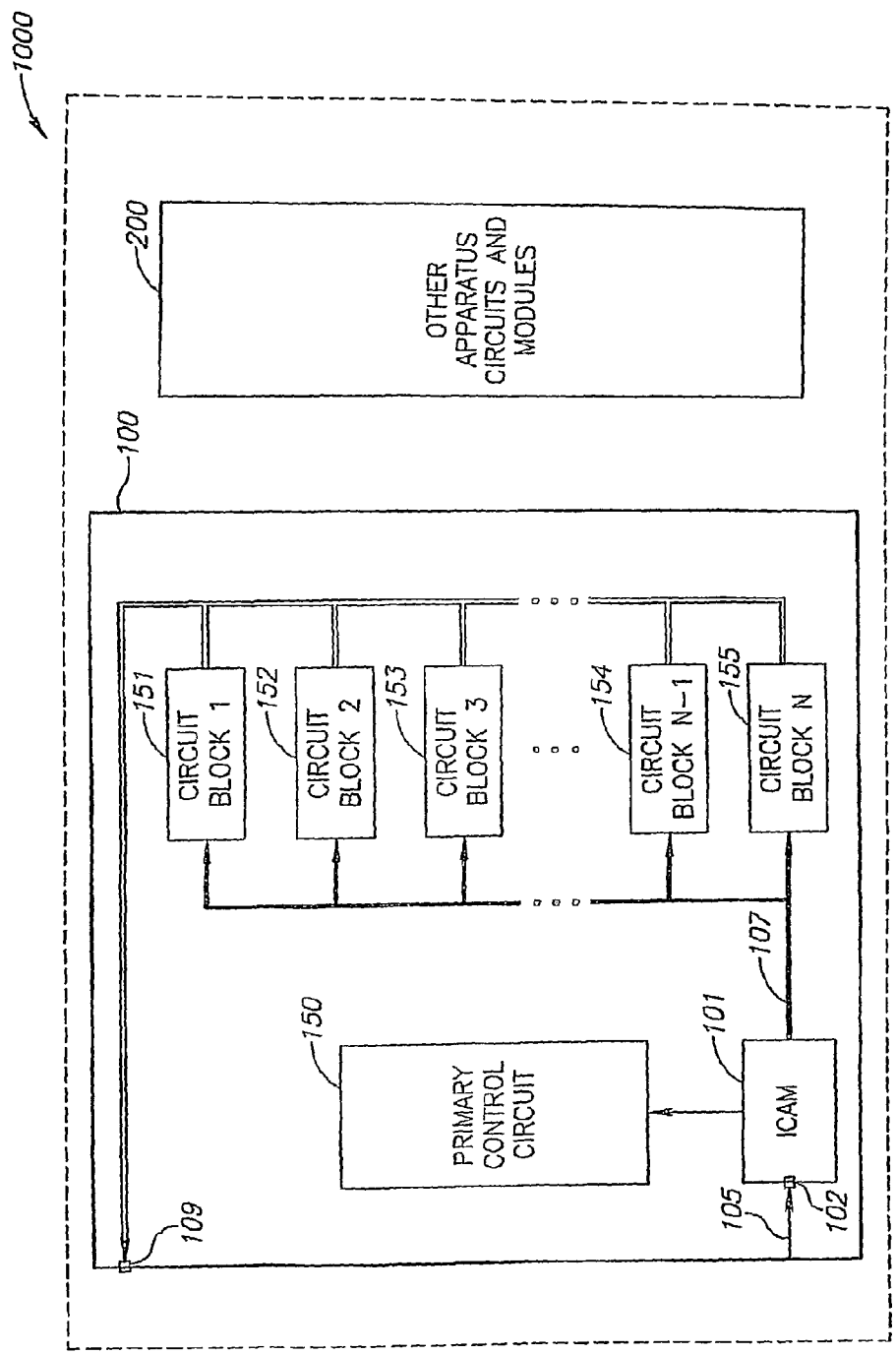
FIG. 1 schematically illustrates a functional block diagram of an exemplary IC device 100, including an ICAM 101, comprised in an apparatus 1000, in accordance with an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "$X_{yz}$". Additionally, plurals of glossary terms may or may not include an apostrophe before the final "s"—for example, ABCs or ABC's.

adder In electronics, an adder or summer is a digital circuit that performs addition of numbers.

algorithm In mathematics, computing, linguistics, and related disciplines, an algorithm is a definite list of well-defined instructions for completing a task; that given an initial state, will proceed through a well-defined series of successive states, eventually terminating in an end-state.

anisotropic literally, one directional. An example of an anisotropic process is sunbathing. Only surfaces of the body exposed to the sun become tanned. (see "isotropic").

array memory cells may optionally be organized in an array of rows and columns, and may be connected to selected bit lines and word lines in the array. The array may be organized into various logical sections containing pluralities of memory cells, such as blocks, pages and sectors. Some of these sections may be physically isolated and operated independently from one another. The array may physically be divided into various sections, which may be referred to as:

Array Area (AA)—memory cells, bit lines, word lines, contacts to bit lines and word lines Cell Area—portion of the Array Area which comprises memory cells Contact Area—a portion of the Array Area devoid of memory cells (and word lines) to allow for BL contacts Periphery Area—a portion of the memory chip, adjacent or surrounding the Array Area, comprising control circuitry, typically CMOS, for operating the Array associative array An associative array (also associative container, map, mapping, hash, dictionary, finite map, lookup table, and in query-processing an index or index file) is an abstract data type composed of a collection of keys and a collection of values, where each key is associated with one value. The operation of finding the value associated with a key is called a lookup or indexing, and this is the most important operation supported by an associative array. The relationship between a key and its value is sometimes called a mapping or binding. For example, if the value associated with the key "bob" is 7, we say that our array maps "bob" to 7.

BER short for bit error rate. In telecommunication, an error ratio is the ratio of the number of bits, elements, characters, or blocks incorrectly received to the total number of bits, elements, characters, or blocks sent during a specified time interval. The most commonly encountered ratio is the bit error ratio (BER)—also sometimes referred to as bit error rate.

binary system The binary numeral system, or base-2 number system, is a numeral system that represents numeric values using only two symbols, usually "0" and "1". Owing to its straightforward implementation in electronic circuitry, the binary system is used internally by virtually all modern computers. Many 1s and 0s can be strung together to represent larger numbers. Starting at the right is the "place" for "ones", and there can be either 0 or 1 one's. The next "place" to the left is for "twos", and there can be either 0 or 1 0 two's. The next "place" to the left is for "fours", and there can be either 0 or 1 0 fours. The next "place" to the left is for "eights", and there can be either 0 or 1 0 eights. This continues for as many places as desired, typically 4, 8, 16, 32 or 64 places. For example, 0000 represents zero (a "0" in all four places)

0001 represents one (a "1" in the ones place, and 0s in all of the other three places)

0010 represents two (a "1" in the twos place, and 0s in the other three places)

0011 represents three (a "1" in the ones place, plus a "1" in the twos place)

0100 represents four (a "1" in the fours place, and 0s in all of the other three places)

1000 represents eight (a "1" in the eights place, and 0s in all of the other three places)

1010 represents ten (a "1" in the eights place, plus a "1" in the twos place) In binary notation, each "place" to the left of the first (ones) place has a possible value of either 0 or, if there is a "1" in the place, two times the value of the place immediately to the right. Hence, from right (least significant bit) to left (most significant bit), the places have a value of either 0 or 1, 2, 4, 8, 16, 32, 64, 128, and so forth.

bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16K Bytes is treated as a "page". That is the "mathematical" definition of "bit". In some cases, the actual (physical) left and right charge storage areas of an NROM cell are conveniently referred to as the left "bit" and the right "bit", even though they may store more than one binary bit (with MLC, each storage area can store at least two binary bits). The intended meaning of "bit" (mathematical or physical) should be apparent from the context in which it is used.

BL short for bit line. The bit line is a conductor connected to the drain (or source) of a memory cell transistor.

block code In computer science, a block code is a type of channel coding. It adds redundancy to a message so that, at the receiver, one can decode with minimal (theoretically zero) errors, provided that the information rate (amount of transported information in bits per sec) would not exceed the channel capacity. The main characterization of a block code is that it is a fixed length channel code (unlike source coding schemes such as Huffman coding, and unlike channel coding methods like convolutional encoding). Typically, a block code takes a k-digit information word, and transforms this into an n-digit codeword.

byte A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, for example, kilobyte (KB), megabyte (MB) and gigabyte (GB).

cache In computer science, a cache is a collection of data duplicating original values stored elsewhere or computed earlier, where the original data is expensive to fetch (due to longer access time) or to compute, compared to the cost of reading the cache. In other words, a cache is a temporary storage area where, for example, frequently accessed data can be stored for rapid access. Once the data is stored in the cache, future use can be made by accessing the cached copy rather than re-fetching or recomputing the original data, so that the average access time is shorter.

cap a term used to describe layers of a material disposed over another, dissimilar material, typically to protect the underlying material from damage during subsequent processing steps. A cap may be left in place, or removed, depending upon the situation.

cell the term "cell" may be used to describe anything, such as a NVM cell, that can store one unit of analog data. This includes FG memory cells, and non-FG memory cells, such as NROM. See half cell.

Cell Well (CW) the cell well is an area in the silicon substrate that is prepared for functioning as a transistor or memory cell device by doping with an electron acceptor material such as boron or indium (p, electron acceptors or holes) or with an electron donor material such as phosphorous or arsenic (n, electron donors). The depth of a cell well is defined by the depth of the dopant distribution.

channel coding In computer science, a channel code is a broadly used term mostly referring to the forward error correction code and bit interleaving in communication and storage where the communication media or storage media is viewed as a channel. The channel code is used to protect data sent over it for storage or retrieval even in the presence of noise (errors).

CHE short for channel hot electron. CHE is an "injection mechanism" for injecting electrons into a charge storage area of an NVM memory cell.

CHEI short for channel hot electron injection. sometimes abbreviated "CHE".

CMOS short for complementary metal oxide semiconductor. CMOS consists of n-channel and p-channel MOS transistors. Due to very low power consumption and dissipation, as well as minimization of the current in "off" state, CMOS is a very effective device configuration for implementation of digital functions. CMOS is a key device in state-of-the-art silicon microelectronics.

CMOS Inverter: A pair of two complementary transistors (a p-channel and an n-channel) with the source of the n-channel transistor connected to the drain of the p-channel transistor and the gates connected to each other. The output (drain of the p-channel transistor) is high whenever the input (gate) is low, and the other way round. The CMOS inverter is the basic building block of CMOS digital circuits.

NMOS: n-channel CMOS.

PMOS: p-channel CMOS.

CMP short for chemical-mechanical polishing. CMP is a process, using both chemicals and abrasives, comparable to lapping, for removing material from a built up structure, resulting in a particularly planar resulting structure.

comparator In electronics, a comparator is a device which compares two voltages or currents and switches its output to indicate which is larger. More generally, the term is also used to refer to a device that compares two items of data.

complement In many different fields, the complement of "X" is something that, together with "X", makes a complete whole, something that supplies what "X" lacks. The concept of "complement" has a variety of uses in mathematics and computer science. For example:
  (a) a system known as "ones' complement" can be used to represent negative numbers. The ones' complement form of a negative binary number is the bitwise NOT applied to it—the complement of its positive counterpart.
  (b) a "two's complement" of a binary number is defined as the value obtained by subtracting the number from a large power of two (specifically, from 2N for an N-bit two's complement).

convolutional code In telecommunication, a convolutional code is a type of error-correcting code in which (a) each m-bit information symbol (each m-bit string) to be encoded is transformed into an n-bit symbol, where m/n is the code rate (n≧m) and (b) the transformation is a function of the last k information symbols, where k is the constraint length of the code.

distribution overlap A number of cells programmed at a given program level may exhibit a distribution of threshold voltages. Usually, the distribution for one program level is separated from a distribution for another program level. However, due to threshold drift, one or both of the distributions may move towards the other, causing some of the threshold voltages to be the same. The region where the threshold voltages are the same for cells programmed at two different program levels is the distribution overlap.

disturb When applying a pulse to a specific bit by raising WL and BL voltages, neighboring bits located on the same WL or same BL might suffer from Vt shift that cause margin loss. The shift is called "disturb". Disturbs are a fault type where the content of a cell is unintentionally altered when operating on another cell. These faults have similar characteristics to coupling faults, however, they have special neighborhood requirements.

Disturb faults are generally caused by the presence of high/intermediate electric field stress on an insulating layer within the core memory cell. This electric field results in leakage current caused either by FN-tunneling, punchthrough, or channel hot electron injection. Whether a given mechanism is responsible for a particular disturb is a function of the operating conditions and the state of the investigated cell.

The IEEE Standard Definition and Characterization of Floating Gate Semiconductor Arrays disturb faults can be divided into the following:

Word-line erase disturb (WED): Exists when a cell under program (selected cell) causes another unprogrammed cell (unselected cell), sharing the same wordline, to be erased.

Word-line program disturb (WPD): Exists when a cell under program (selected cell) causes another unprogrammed cell (unselected cell), sharing the same wordline, to be programmed.

Bit-line erase disturb (BED): Exists when a cell under program (selected cell) causes another unprogrammed cell (unselected cell), sharing the same bit-line, to be erased.

Bit-line program disturb (BPD): Exists when a cell under program (selected cell) causes another unprogrammed cell (unselected cell), sharing the same bit-line, to be programmed.

Read disturb (RD): During read operation, the bias conditions are the same as programming conditions (except for lower voltage magnitudes) and can result in the injection of electrons from drain to FG, thus programming the selected cell. This is known as a soft program. In addition, unselected erased cells may become programmed, and those that are programmed may become erased, giving rise to what is known as gate read erase and channel read program, respectively. Both of these disturbs that occur on un-addressed cells are considered to be another form of read disturbs.

Dopant element introduced into semiconductor to establish either p-type (acceptors) or n-type (donors) conductivity; common dopants in silicon: p-type, boron, B, Indium, In; n-type phosphorous, P, arsenic, As, antimony, Sb.

ECC short for error correcting code. An error-correcting code (ECC) is a code in which each data signal conforms to specific rules of construction so that departures from this construction in the received signal can generally be automatically detected and corrected. It is used in computer data storage, for example in dynamic RAM, and in data transmission.

Some codes can correct a certain number of bit errors and only detect further numbers of bit errors. Codes which can correct one error are termed single error correcting (SEC), and those which detect two are termed double error detecting (DED). Hamming codes can correct single-bit errors and detect double-bit errors—SEC-DED. More sophisticated codes correct and detect even more errors.

An error-correcting code which corrects all errors of up to n bits correctly is also an error-detecting code which can detect at least all errors of up to 2n bits. Two main categories are convolutional codes and block codes. Examples of the latter are Hamming code, BCH code, Reed-Solomon code, Reed-Muller code, Binary Golay code, and low-density parity-check codes.

ED bits as used herein, ED bits are numbers which may be calculated for and stored along with data being programmed (stored), which are indicative of the number of cells (or half-cells) at any given program level, for example, 512 cells (or half cells) at program level "10". During a subsequent read operation, the ED bits may be retrieved along with the data which was stored, the number of cells at the given program levels are counted, and these counts are compared with the ED bits. If there is a mismatch, this indicates a read error, and an error correction scheme such as "moving read reference" can be implemented. See moving read reference.

EEPROM short for electrically erasable, programmable read only memory. EEPROMs have the advantage of being able to selectively erase any part of the chip without the need to erase the entire chip and without the need to remove the chip from the circuit. The minimum erase unit is 1 Byte and, more typically, a full Page. While an erase and rewrite of a location appears nearly instantaneous to the user, the write process is usually slightly slower than the read process; the chip can usually be read at full system speeds.

endurance Because they are written by forcing electrons through a layer of electrical insulation onto a floating gate (or charge trapping medium), some NVM can withstand only a limited number of write and erase cycles before the insulation is permanently damaged, and the ability of the cell to function correctly is compromised. In modern Flash EEPROM, the endurance may exceed 1,000,000 write/erase cycles.

EPROM short for erasable, programmable read only memory. EPROM is a memory cell in which information (data) can be erased and replaced with new information (data).

erase a method to erase data on a large set of bits in the array, by applying a voltage scheme that injects holes in the bit set. This method causes all bits to reach a low Vt level. See program and read.

Error Detection and Correction In computer science, telecommunication, and information theory, error detection and correction has great practical importance in maintaining data (information) integrity across noisy channels and less-than-reliable storage media. More particularly, Error detection is the ability to detect the presence of errors caused by noise or other impairments during transmission from the transmitter to the receiver.

Error correction is the additional ability to reconstruct the original, error-free data.

FEC short for forward error correction. In telecommunication, forward error correction (FEC) is a system of error control for data transmission, whereby the sender adds redundant data to its messages, which allows the receiver to detect and correct errors (within some bounds), without the need to ask the sender for additional data. The advantage of forward error correction is that retransmission of data can often be avoided, at the cost of higher bandwidth requirements on average, and is therefore applied in situations where retransmissions are relatively costly or impossible.

FET short for field effect transistor. The FET is a transistor that relies on an electric field to control the shape and hence the conductivity of a "channel" in a semiconductor material. FETs are sometimes used as voltage-controlled resistors. The terminals of FETs are called gate, drain and source.

FG short for floating gate. The floating-gate transistor is a kind of transistor that is commonly used for non-volatile storage such as flash, EPROM and EEPROM memory. Floating-gate transistors are almost always floating-gate MOSFETs. Floating-gate MOSFETs are useful because of their ability to store an electrical charge for extended periods of time even without a connection to a power supply.

Flash memory Flash memory is a form of non-volatile memory (EEPROM) that can be electrically erased and reprogrammed. Flash memory architecture allows multiple memory locations to be erased or written in one programming operation. Two common types of flash memory are NOR ("Not Or") and NAND flash. NOR and NAND flash get their names from the structure of the interconnections between memory cells. In NOR flash, cells are connected in parallel to the bit lines, allowing cells to be read and programmed individually. The parallel connection of cells resembles the parallel connection of transistors in a CMOS NOR gate. In NAND ("Not And") flash, cells are connected in series, resembling a NAND gate, and preventing cells from being read and programmed individually: the cells connected in series must be read in series.

flip-flop In electronics, an electronic circuit which has two stable states and thereby is capable of serving as one bit of memory. A flip-flop is usually controlled by one or two control signals and/or a gate or clock signal. The output often includes the complement as well as the normal output. As flip-flops are implemented electronically, they naturally also require power and ground connections.

FN tunneling Field emission—also called Fowler-Nordheim tunneling—is the process whereby electrons tunnel through a barrier in the presence of a high electric field. This quantum mechanical tunneling process is an important mechanism for thin barriers such as those in metal-semiconductor junctions on highly-doped semiconductors. Using FN tunneling, electrons can be moved to the floating gate of a MOSFET memory cell.

Gray code The reflected binary code, also known as Gray code after Frank Gray, is a binary numeral system where two successive values differ in only one digit. The reflected binary code was originally designed to prevent spurious output from electromechanical switches. Today, Gray codes are widely used to facilitate error correction in digital communications. An example of a two-bit binary Grey code sequence is 00, 01, 11, 10. An example of a three-bit binary Grey code sequence is 000, 001, 011, 010, 110, 111, 101, 100.

half cell "half cell" (or "half-cell") is a term which is sometimes used to refer to the two distinct charge storage areas (left and right bits) of an NROM memory cell.

Hamming code In telecommunication, a Hamming code is a linear error-correcting code named after its inventor, Richard Hamming. Hamming codes can detect and correct single-bit errors. In other words, the Hamming distance between the transmitted and received code-words must be zero or one for reliable communication. Alternatively, it can detect (but not correct) up to two simultaneous bit errors. In contrast, the simple parity code cannot correct errors, nor can it be used to detect more than one error (such as where two bits are transposed).

HHI short for hot hole injection. HHI is an "injection mechanism" for injecting holes into a charge storage area of an NVM memory cell. See CHE.

Information theory Information theory is a branch of applied mathematics and engineering involving the quantification of information. Historically, information theory developed to find fundamental limits on compressing and reliably communicating data. A key measure of information that comes up in the theory is known as information entropy, which is usually expressed by the average number of bits needed for storage or communication. Intuitively, entropy quantifies the uncertainty involved in a random variable. For example, a fair coin flip will have less entropy (2 possible outcomes) than a roll of a die (6 possible outcomes).

Inhibit If it is desired to apply erase to a subset of bits, avoiding erase from other bits sharing the same bit lines (BLs), an inhibit signal may be applied on the others, for example, as a positive voltage on the gate, to avoid hole injection. This procedure is called inhibit.

mask a layer of material which is applied over an underlying layer of material, and patterned to have openings, so that the underlying layer can be processed where there are openings. After processing the underlying layer, the mask may be removed. Common masking materials are photoresist and nitride. Nitride is usually considered to be a "hard mask".

LDPC short for low-density parity check. In information theory, a low-density parity-check code (LDPC code) is an error correcting code, a method of transmitting a message over a noisy transmission channel. While LDPC and other error correcting codes cannot guarantee perfect transmission, the probability of lost information can be made as small as desired. LDPC was the first code to allow data transmission rates close to the theoretical maximum, the Shannon Limit. See, for example, the article "LDPC: Another Key Step Toward Shannon, New low-density parity check (LDPC) error correction techniques push wireless and networking channel performance closer to the Shannon Limit. Here's How.", by Tony Summers, Comtech AHA Corporation, Oct. 14, 2004, incorporated by reference herein.

logical operators A logical connective, also called a truth-functional connective, logical operator or propositional operator, is a logical constant which represents a syntactic operation on a sentence, or the symbol for such an operation that corresponds to an operation on the logical values of those sentences. A logical connective serves to return (results in) a "true" or "false" value (such as binary "0" or binary "1") when applied to arguments (operators) also having true or false values. For example, some common logical operators are:

AND the AND operator results in a value of "true" only if both of the operands (A,B) has a value of "true". (In binary terms, if A="1" and B="1", then the result is "1". Otherwise, the result is "0".)

OR the OR operator results in a value of "true" if one or the other, or both of the operands (A,B) has a value of "true". (In binary terms, if either one of A or B="1" and B="1", the result is "1". Otherwise, the result is "0".)

XOR short for exclusive "or". the XOR operator results in a value of "true" if and only if exactly one of the operands (A,B) has a value of "true". (In binary terms, if only one of A or B="1" and B="1", the result is "1". Otherwise, the result is "0".)

MLC short for multi-level cell. In the context of a floating gate (FG) memory cell, MLC means that at least two bits of information can be stored in the memory cell. In the context of an NROM memory cell, MLC means that at least four bits of information can be stored in the memory cell—at least two bits in each of the two charge storage areas.

MOS short for metal oxide semiconductor.

MOSFET short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

moving read reference as used herein, "moving read reference" (or "moving reference") refers to a technique, such as disclosed in U.S. Pat. No. 6,992,932 wherein reference voltages are determined to be used in reading cells programmed to a given program state. Generally, if an error is detected, such as by using error detection (ED) bits, the reference voltages may have to be adjusted until the error is resolved. See ED bits.

multiplexer In electronics, a multiplexer or mux is a device that performs multiplexing: it selects one of many analog or digital data sources and outputs that source into a single channel.

nitride commonly used to refer to silicon nitride (chemical formula Si3N4). A dielectric material commonly used in integrated circuit manufacturing. Forms an excellent mask (barrier) against oxidation of silicon (Si). Nitride is commonly used as a hard mask or, in the case of an NVM memory cell having an ONO layer, as a charge-trapping material.

n-type semiconductor in which concentration of electrons is higher than the concentration of "holes". See p-type.

NROM short for nitride(d) read only memory. Generally, a FET-type device having a charge trapping medium such as a nitride layer for storing charges (electrons and holes) in two discrete areas, near the source and drain diffusions, respectively.

NVM short for non-volatile memory. NVM is computer memory that can retain the stored information even when not powered. Examples of non-volatile memory include read-only memory, flash memory, most types of magnetic computer storage devices (for example hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations, which make it unsuitable for use as primary storage. Typically non-volatile memory either costs more or performs worse than volatile random access memory. (By analogy, the simplest form of an NVM memory cell is a simple light switch. Indeed, such a switch can be set to one of two (binary) positions, and "memorize" that position.) NVM includes floating gate (FG) devices and NROM devices, as well as devices using optical, magnetic and phase change properties of materials.

ONO short for oxide-nitride-oxide. ONO is used as a charge storage insulator consisting of a sandwich of thermally insulating oxide, and charge-trapping nitride.

over-erase a condition that happens to some bits in a large bit set that are erased together, due to erase speed difference, due to the situation that some bits erase faster than other bits. Fast bits are particularly susceptible to over-erase. See erase.

oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films may be obtained by thermal oxidation of silicon.

poly short for polycrystalline silicon (Si). Heavily doped poly Si is commonly used as a gate contact in silicon MOS and CMOS devices.

p-type semiconductor in which concentration of "holes" is higher than the concentration of electrons. See n-type. Examples of p-type silicon include silicon doped (enhanced) with boron (B), Indium (In), and the like.

page Generally, a grouping of memory cells can be termed a word, a grouping of words can be termed a page, and a grouping of pages can be termed a sector. Data may be accessed for reading and programming (or writing) by word or by page, while an entire sector is commonly accessed for erasing.

PFROM short program flashROM. An inner design block (of Saifun) that stores instructions that the inner embedded microcontroller performs on flash devices.

program a method to program a bit in an array, by applying a voltage scheme that injects electrons. This method causes an increase in the Vt of the bit that is being programmed. Alternatively, with "high Vt erase", programming may be a lowering of the Vt of the memory cell. See erase and read. Program may sometimes, erroneously be referred to as "write". See write.

program rate as used herein, "program rate" refers to the number of times that a memory cell (or half cell) is programmed to various program (or threshold voltage) levels, such as representing a binary "1" or "0".

Program time refers to the duration of a single program pulse, or the duration of the whole program sequence algorithm to program a bit set.

Programmed "programmed" generally means that the threshold voltage (Vt) of a cell is above a predetermined "program verify" level (Vth).

PROM short for programmable read-only memory.

RAM short for random access memory. RAM refers to data storage formats and equipment that allow the stored data to be accessed in any order—that is, at random, not just in sequence. In contrast, other types of memory devices (such as magnetic tapes, disks, and drums) can access data on the storage medium only in a predetermined order due to constraints in their mechanical design.

read a method to read the digital data stored in the array. The read operation is usually performed in "blocks" of several cells. See erase and program.

Reed-Solomon Reed-Solomon error correction is an error-correcting code that works by oversampling a polynomial constructed from the data. The polynomial is evaluated at several points, and these values are sent or recorded. By sampling the polynomial more often than is necessary, the polynomial is over-determined. As long as "many" of the points are received correctly, the receiver can recover the original polynomial even in the presence of a "few" bad points.

refresh a part of the program or erase algorithms that checks the status of bits and applies pulses to bits that may have lost some of their Vt due to reliability margin loss.

register In electronics, a register is a small amount of storage whose contents can be accessed more quickly than storage available elsewhere. Registers are normally measured by the number of bits they can hold, for example, an "8-bit register" or a "32-bit register". Registers are now usually implemented as a register file, but they have also been implemented using individual flip-flops.

resist short for photoresist; also abbreviated "PR". Photoresist is often used as a masking material in photolithographic processes to reproduce either a positive or a negative image on a structure, prior to etching (removal of material which is not masked). PR is usually washed off after having served its purpose as a masking material.

retention Retention generally refers to the ability of a memory cell to retain charges inserted into the charge storage medium, such as a floating gate. The data retention of EPROM, EAROM, EEPROM, and Flash may be limited by charge leaking from the floating gates of the memory cell transistors. Leakage is exacerbated at high temperatures or in high-radiation environments.

ROM short for read-only memory.

salicide The term salicide refers to a technology used in the microelectronics industry for the purpose of reducing the sheet resistance of the exposed silicon and poly-silicon areas. The salicide process involves the reaction of a thin metal film with silicon ultimately forming a metal silicide through a series of annealing and/or etch processes. The term "salicide" is a compaction of the phrase self-aligned silicide. The description "self-aligned" suggests that the silicide formation does not require lithographic patterning processes, as opposed to a non-aligned technology such as polycide. The term salicide is also used to refer to the metal silicide formed by the contact formation process, such as "titanium salicide", although this usage is inconsistent with accepted naming conventions in chemistry. The salicide process may begin with deposition of a thin transition metal layer over fully formed and patterned semiconductor devices (such as transistors). The wafer is heated, allowing the transition metal to react with exposed silicon (such as source, drain, gate) forming a low-resistance transition metal silicide. The transition metal does not react with the silicon oxide and or nitride insulators present on the wafer. Following the reaction, any remaining transition metal is removed by chemical etching, leaving silicided silicon. The silicided silicon is then further heat treated to form a lower resistance silicide.

scientific notation Scientific notation, also known as standard form, is a notation for writing numbers that is often used by scientists and mathematicians to make it easier to write large and small numbers. A number that is written in scientific notation has several properties that make it very useful to scientists.

The basic concept for the practical notations is this mathematical exponential expression using powers of ten, for example: $a \times 10^b$ ("a" times ten raised to the "b"th power).

"E notation" is related to, and a form of scientific notation. Most calculators and many computer programs present very large and very small results in scientific notation. Because exponents like $10^7$ (ten to the seventh power) cannot always be conveniently represented on computers, typewriters, and calculators, an alternate notation, "E notation" is often used: the letter "E" or "e" is used for "times ten raised to the power", with all numbers being written on the same line, without superscripts, for example "$3 \times 10^{13}$" (three times 10 to the $13^{th}$ power, or a "1, followed by 12 zeroes) would be written as "3E13".

sector a part of the array, usually larger than a page, which usually contains a few pages. A minimum erase might include a sector. For example:

Erase Sector (ES): Group of cells that are erased by single erase command

Physical Sector (PS): Group of ES connected by single grid of Word Lines (WL) and Bit Lines (BL), sharing same set of drivers.

self-aligned In fabrication of MOSFETs on integrated circuits, a self-aligned gate is an arrangement where the edges of the source and drain doping regions next to the gate are defined by the same mask that defines the edges of the gate next to the source and drain regions. An overlap between the source, drain and gate regions would be difficult to achieve without the self-aligned feature (due to the inherent misalignment between different masking layers). "Self-aligned" may also refer to any process step where a previously-formed structure acts as a mask for a subsequent process step, such as deposition or etching.

Shannon Limit Information theory is generally considered to have been founded in 1948 by Claude Shannon in his seminal work, "A Mathematical Theory of Communication" The Bell System Technical Journal, Vol. 27, pp. 379-423, 623-656, July, October 1948, herein incorporated by reference in its entirety. The central paradigm of classical information theory is the engineering problem of the transmission of information over a noisy channel. The most fundamental results of this theory are Shannon's source coding theorem, which establishes that, on average, the number of bits needed to represent the result of an uncertain event is given by its entropy; and Shannon's noisy-channel coding theorem, which states that reliable communication is possible over noisy channels provided that the rate of communication is below a certain threshold called the channel capacity. The channel capacity can be approached by using appropriate encoding and decoding systems.

Shannon's theorem is an important theorem in error correction which describes the maximum attainable efficiency of an error-correcting scheme versus the levels of noise interference expected. In general, these methods put redundant information into the data stream following certain algebraic or geometric relations so that the decoded stream, if damaged in transmission, can be corrected. The effectiveness of the coding scheme is measured in terms of code rate, which is the code length divided by the useful information, and the coding gain, which is the difference of the SNR levels of the uncoded and coded systems required to reach the same BER levels. Shannon's noisy-channel coding theorem states that reliable communication is possible over noisy channels provided that the rate of communication is below a certain threshold called the channel capacity, or "Shannon Limit".

Si Silicon, a semiconductor.

SLC short for single level cell. In the context of a floating gate (FG) memory cell, SLC means that one bit of information can be stored in the memory cell. In the context of an NROM memory cell, SLC means that at least two bits of information can be stored in the memory cell.

SNR short for signal-to-noise ratio. SNR (often abbreviated SNR or S/N) is an electrical engineering concept, also used in other fields (such as scientific measurements, biological cell signaling and oral lore), defined as the ratio of a signal power to the noise power corrupting the signal. In less technical terms, signal-to-noise ratio compares the level of a desired signal (such as music) to the level of background noise. The higher the ratio, the less obtrusive the background noise is.

SONOS Si-Oxide-Nitride-Oxide-Si, another way to describe ONO with the Si underneath and the Poly gate on top.

spacer a spacer, as the name implies, is a material (such as a layer of oxide) disposed on an element (such as a poly gate electrode). For example, sidewall spacers disposed on opposite sides of a gate electrode structure cause subsequent implants to occur further away from the gate than otherwise (without the spacers in place), thereby controlling (increasing) the length of a channel under the gate electrode structure.

SRAM short for static random access memory. SRAM is a type of semiconductor memory. The word "static" indicates that the memory retains its contents as long as power remains applied, unlike dynamic RAM (DRAM) that needs to be periodically refreshed (nevertheless, SRAM should not be confused with read-only memory and flash memory, since it is volatile memory and preserves data only while power is continuously applied). SRAM should not be confused with SDRAM, which stands for synchronous DRAM and is entirely different from SRAM, or with pseudostatic RAM (PSRAM), which is DRAM configured to function, to an extent, as SRAM.

standard deviation In probability and statistics, the standard deviation of a probability distribution, random variable, or population or multi-set of values is a measure of the spread of its values. It is usually denoted with the letter σ (lower case sigma). It is defined as the square root of the variance.

To understand standard deviation, keep in mind that variance is the average of the squared differences between data points and the mean. Variance is tabulated in units squared. Standard deviation, being the square root of that quantity, therefore measures the spread of data about the mean, measured in the same units as the data.

Said more formally, the standard deviation is the root mean square (RMS) deviation of values from their arithmetic mean.

The standard deviation is a measure of statistical dispersion. In plain English, it's a way of describing how spread out a set of values are around the mean of that set.

For example, if you have a set of height measurements, you can easily work out the arithmetic mean (just sum up all the individual height measurements and then divide by the number of those measurements). However, knowing the mean (or average, as it's more commonly called), doesn't tell you about the spread of those heights. Were all the people in your group the same height, or did you have some tall and some short, or was there one really tall person who towered over everybody else? It's possible that you could have exactly the same average height from wildly different groups. Knowing about how spread out those heights are compared to the mean gives you extra information over and above the mean value.

Units of Length Various units of length may be used herein, as follows:

meter (m) A meter is the Si unit of length, slightly longer than a yard. 1 meter=~39 inches. 1 kilometer (km)=1000 meters=~0.6 miles. 1,000,000 microns=1 meter. 1,000 millimeters (mm)=1 meter. 100 centimeters (cm)=1 meter.

micron (μm) one millionth of a meter (0.000001 meter); also referred to as a micrometer.

mil 1/1000 or 0.001 of an inch; 1 mil=25.4 microns.

nanometer (nm) one billionth of a meter (0.000000001 meter).

Angstrom (Å) one tenth of a billionth of a meter. 10 Å=1 nm.

verify a read operation, after applying a program or erase pulse, that checks if the applied program or erase pulse moved the Vt to the target level (program-verify or erase-verify level).

V short for voltage. Different voltages may be applied to different parts of a transistor or memory cell to control its operation, such as:

Vb short for bulk (or substrate) voltage
Vd short for drain voltage
Vg short for gate voltage
Vs short for source voltage
Vt short for threshold voltage wear leveling Wear levelling (also written wear leveling) refers to a technique for prolonging the service life of some kinds of erasable computer storage media, such as flash memory. EEPROM and flash memory media have individually erasable segments, each of which can be put through a finite number of erase cycles before becoming unreliable. This can be anywhere between 10,000 and 1,000,000 cycles, for example, for NAND flash devices. Wear-levelling attempts to work around these limitations by arranging data so that erasures and re-writes are distributed evenly across the medium. In this way, no single sector prematurely fails due to a high concentration of write cycles.

word line or wordline, (WL). A conductor normally connected to the gate of a memory cell transistor. The wordline may actually be the gate electrode of the memory cell.

write a combined method usually involving first erasing a large set of bits, then programming new data into the bit set; the erase step is not required but it is customary. See erase and program.

In addition to the above, some abbreviations or terminology that may be used herein, or in a provisional application (if any) from which this non-provisional application claims priority, may include:

addr short for adder bpc, b/c, [b/c] short for bits per cell (or half-cell, depending on context)

comp short for comparator

DPM short for defects per million

ECC short for error correction code

ED short for error detection

FF short for flip-flop

IECC short for internal error correction

LSB short for least significant bit

MSB short for most significant bit.

mux short for multiplexer

OTP short for one time programmable

Rd short for read sigma bits a type of error correction bits, the derivation and use of which is explained in this disclosure

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that, throughout the specification, discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

Reference is made to FIG. 1 which schematically illustrates a functional block diagram of an exemplary IC device 100, including an ICAM 101, comprised in an apparatus 1000, in accordance with an embodiment of the invention. Apparatus 1000 may optionally comprise a plurality of ICs 100. Apparatus 1000 additionally comprises circuits/modules 200, the circuits and modules adapted to perform functions associated with the application of apparatus 1000. For example, in some embodiments of the invention, apparatus 1000 may be used in, or included in, communication systems, medical systems, transportation systems, computer systems, consumer electronic systems, power transmission systems, and/or other systems comprising the use of ICs. Examples of apparatus 1000 may include, for example, desktop computers and workstation, portable computers, mobile telephones, avionics, and medical imaging equipment.

Apparatus 1000 may include or may be part of a computing system including a processor, a memory, a storage unit, an input unit, an output unit, a communication unit, and/or any other suitable component. Apparatus 1000 includes IC 100 which may be, for example, a multi-core processor (CMP), a multiprocessor, a central processing unit (CPU), a digital signal processor (DSP), a microprocessor, a host processor, a controller, a plurality of processors or controllers, a chip, a microchip, circuitry, a logic unit, an integrated circuit (IC), an application-specific IC (ASIC), or any other suitable multi-purpose or specific processor or controller. IC 100 may include, for example, a random access memory (RAM), a dynamic RAM (DRAM), a synchronous DRAM (SD-RAM), a non-volatile memory, a volatile memory, or other suitable memory unit.

Apparatus 1000 may include, for example, a hard disk drive, a floppy disk drive, a compact disk (CD) drive, a CD-ROM drive, a digital versatile disk (DVD) drive, or other suitable removable or non-removable storage units. Apparatus 1000 may include, for example, a keyboard, a keypad, a mouse, a touch-pad, a stylus, a microphone, or other suitable pointing device or input device. Apparatus 1000 may include, for example, a cathode ray tube (CRT) monitor or display unit, a liquid crystal display (LCD) monitor or display unit, a screen, a monitor, a speaker, or other suitable display unit or output device.

Apparatus 1000 may include, for example, a wired or wireless network interface card (NIC), a wired or wireless modem, a wired or wireless receiver and/or transmitter, a wired or wireless transmitter-receiver and/or transceiver, a radio frequency (RF) communication unit or transceiver, or other units able to transmit and/or receive signals, blocks, frames, transmission streams, packets, messages and/or data. Apparatus 1000 may optionally include, or may optionally be associated with, for example, one or more antennas, for example, a dipole antenna, a monopole antenna, an omni-directional antenna, an end fed antenna, a circularly polarized antenna, a micro-strip antenna, a diversity antenna, or the like.

In some embodiments, apparatus 1000 may include, or may be, a Personal Computer (PC); a desktop computer; a mobile computer; a laptop computer; a notebook computer; a tablet computer; a server computer; a handheld computer; a handheld device; a Personal Digital Assistant (PDA) device; a handheld PDA device; an on-board device; an off-board device; a hybrid device; a vehicular device; a non-vehicular device; a mobile or portable device; a non-mobile or non-portable device; a wireless communication station; a wireless communication device; a wireless Access Point (AP); a wired or wireless router; a wired or wireless modem; a unit or device of a wired or wireless network, a Local Area Network (LAN), a Wireless LAN (WLAN), a Metropolitan Area Network (MAN), a Wireless MAN (WMAN), a Wide Area Network (WAN), a Wireless WAN (WWAN), a Personal Area Network (PAN), a Wireless PAN (WPAN), a two-way radio communication system, and/or a cellular radio-telephone communication system; a cellular telephone; a wireless telephone; a Personal Communication Systems (PCS) device; a PDA device which incorporates a wireless communication device; a mobile or portable Global Positioning System (GPS) device; a device which incorporates a GPS receiver or transceiver or chip; a device which incorporates an RFID element or chip; a Multiple Input Multiple Output (MIMO) transceiver or device; a Single Input Multiple Output (SIMO) transceiver or device, a Multiple Input Single Output (MISO) transceiver or device; a multi-standard radio device, a wired or wireless handheld device (such as a BlackBerry, Palm Treo, or the like), a Wireless Application Protocol (WAP) device, or the like.

In accordance with an embodiment of the invention, ICAM 101 comprises a circuit block access module residing on integrated circuit 100. ICAM 101 comprises an input terminal 102 adapted to connect to an external TE (not shown) through a serial data line 105. The TE provides an external serial data comprising command and data signals to ICAM 101, the ICAM adapted to extract data from serial data line 105 into two or more parallel data lines 107. Optionally, the external serial data is generated by circuits/modules 200. Parallel data lines 107 are associated with address lines to N circuit blocks comprised in IC 100, for example, circuit blocks 151-155. Each circuit block, for example, circuit blocks 151-155, is adapted to perform a function within IC 100. For example, for IC 100 being a non-volatile memory (NVM), circuit block 151 may comprise a sensing amplifier, circuit block 152 may comprise a charge pump, circuit block 153 may comprise a memory cell array, circuit block 154 may comprise a row decoder, and circuit block 155 may comprise a column decoder. ICAM 101 may be adapted to override, or optionally bypass, at least a portion of IC 100 primary control circuitry (controller) 150, and may cause commands received over serial data line 105 to be executed. Optionally, ICAM 101 may instruct controller 150, responsive to the binary data, to access the circuit blocks, for example, circuit blocks 151-155.

Data may be accessed from the N circuit blocks, for example blocks 151-155, through parallel data lines 111 leading to an output terminal 109. Output terminal 109 may comprise an IC 100 input/output (I/O) interface) generally controlled by primary control circuit 150. The TE may then read the data by connecting to output terminal 109. Optionally, parallel data lines 111 are dedicated data lines adapted to transfer the accessed data to output terminal 109, responsive to ICAM 101 address calls. Optionally, output terminal 109 may be a dedicated test pad to which the TE may be connected to read the data received through dedicated parallel data lines 111 from the N circuit blocks, for example circuit blocks 151-155. Optionally, output terminal 109 is connected to circuits/modules 200, the circuit/modules adapted to analyze the data obtained through the output terminal. Optionally, ICAM 101 may reside externally to IC 100, and the N circuit blocks, for example blocks 151-155, may be comprised in a plurality of ICs.

Figure 3:
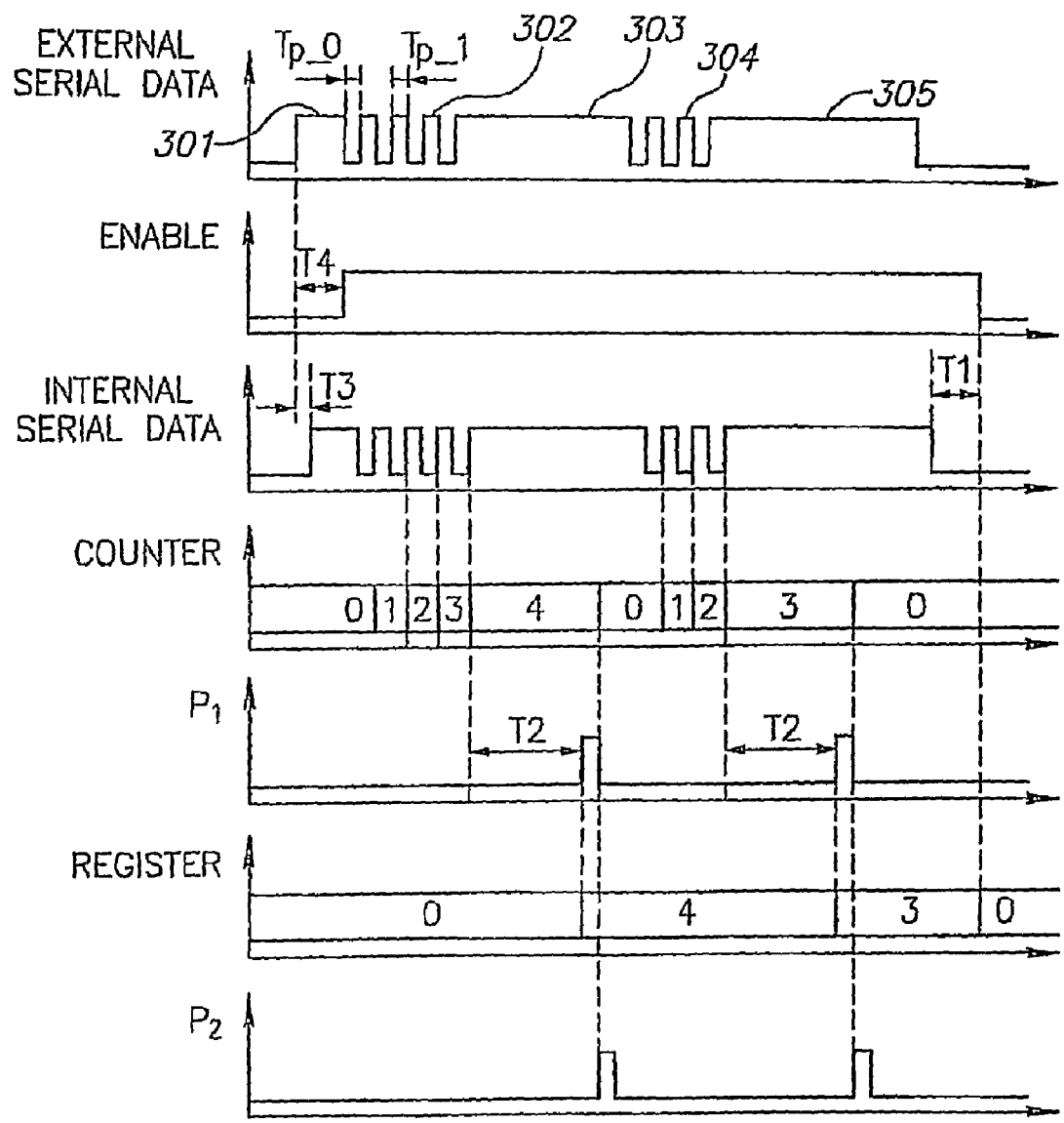
FIG. 3 schematically illustrates a digital timing diagram for the ICAM of FIGS. 1 and 2, in accordance with an embodiment of the invention.

In accordance with some embodiments of the invention, serial data line 105 may comprise the serial data, which may comprise one or more short and long pulses. The short pulses may include information associated with an address of one of the N circuit blocks, for example, circuit block 153. The long pulses may serve to enable and disable ICAM 101. Reference is now also made to FIG. 3, which schematically illustrates a digital timing diagram for ICAM 101, in accordance with an embodiment of the invention. A general format for the serial data is shown in the figure as external serial data, and may include a first long pulse 301, followed by a series of short pulses 302 of pulse width Tp1 and temporally spaced Tp0 apart, and a second long pulse 303. First long pulse 301 and second long pulse 303 may be of a same, or optionally different, pulse width. Depending on the circuit block being accessed, for example block 153, second long pulse 302 may be followed by a series, or optionally a plurality of one or more different series, of short pulses 304 followed by a long pulse 305. Optionally, some or all of the long pulses may include the information associated with the address of the circuit block being accessed, for example, circuit block 153, and some or all the short pulses may be adapted to enable and disable ICAM 101.

In some embodiments of the invention, IC 100 may comprise a built-in self test (BIST) control logic included in primary control circuit 150. The BIST control logic may be adapted to compare the data read from the N circuit blocks, for example, circuit blocks 151-155, with a predetermined data. Responsive to the comparison, controller 150 may send information associated with the comparison to the TE. Optionally, the BIST control logic may be comprised in circuits/apparatus 200. Optionally, controller 150 sends the information of the comparison to circuits/modules 200.

Figure 2:
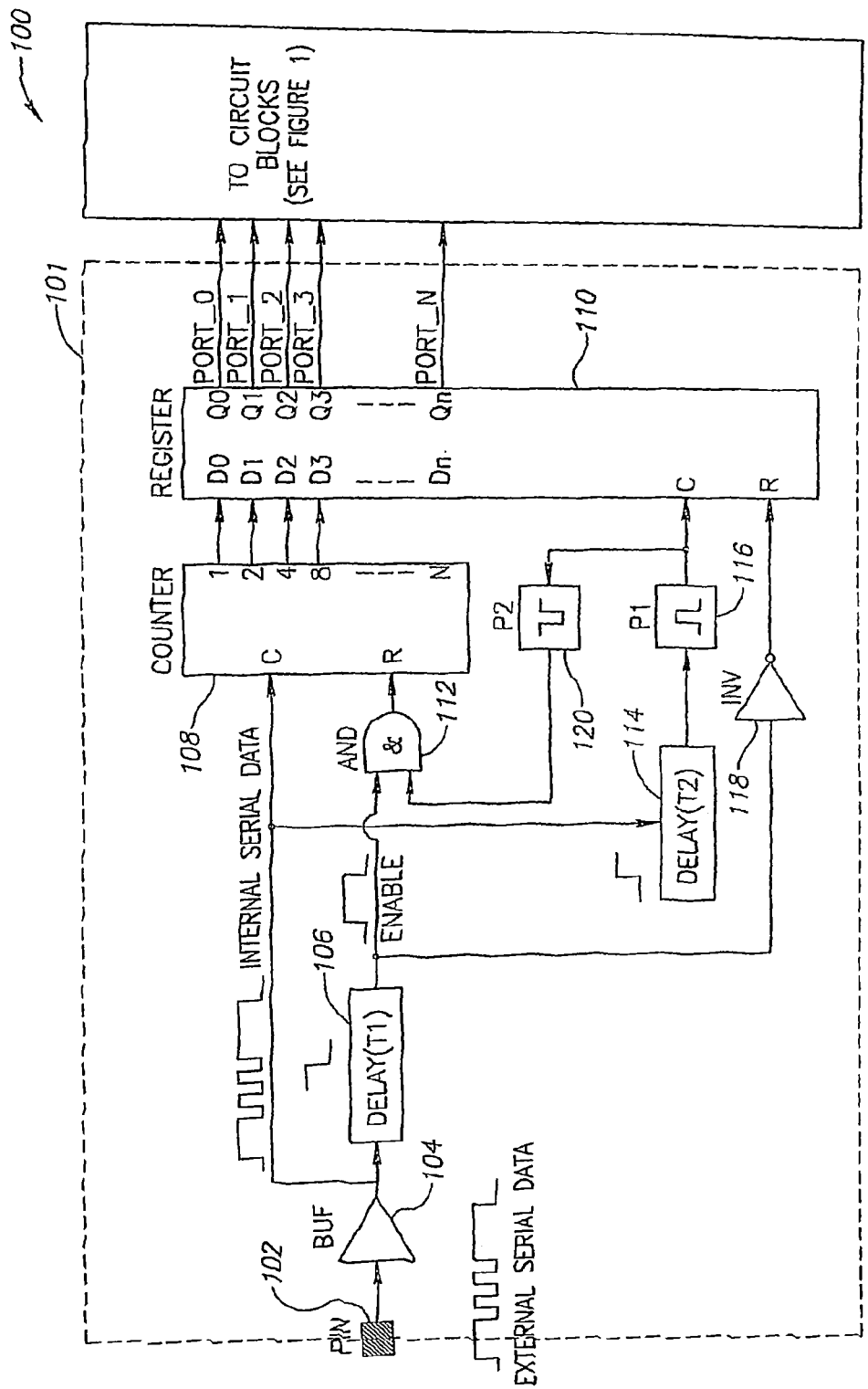
FIG. 2 schematically illustrates a circuit diagram for ICAM 101 comprised in IC 100, in accordance with an embodiment of the invention.

Reference is also made to FIG. 2, which schematically illustrates a circuit diagram of ICAM 101, in accordance with an embodiment of the invention. ICAM 101 comprises an N-bit counter 108 and an N-bit register 110. N-bit counter 108 is adapted to count a leading edge of short pulses 302, and N-bit register 110 is adapted to store a pulse count as binary data. Optionally, ICAM 101 may be adapted to count a trailing edge of short pulses 302. Optionally, ICAM 101 may be adapted to count the leading edge, or the trailing edge, of long pulses 303. The binary data may be associated with the address of the one or more of the N circuit blocks to be accessed.

In a normal mode of memory operation, no external data signal is applied to input terminal 102. and ICAM 101 is disabled; all outputs of counter 108 and register 109 are switched off. Applying serial data to input terminal 102 enables ICAM 101. The serial data is transferred to an input of counter 108, and is transferred substantially in parallel to a first delay circuit 106, and to a second delay circuit 114. First delay circuit 106 is adapted to enable counter 108 when Tp0<T1, where T1 is a predetermined serial data transition time. First delay circuit is further adapted to generate a register reset signal which may be fed through an inverter 118 to reset register 110. Second delay circuit 114 is adapted to activate a first pulse generator 116 when Tp1<T2, where T2 is a predetermined serial data accomplishment period. First pulse generator 116 is adapted to enable register 110, and is further adapted to activate a second pulse generator 120. Second pulse generator 120 is adapted to generate a counter reset signal, which is fed through a logical AND gate 112 to reset counter 108.

In some embodiments of the invention, ICAM 101 may comprise a buffer 104 connected to input terminal 102. Buffer 104, which may be adapted to provide protection to electrostatic discharge (ESD) and to filter noise, and which may be further adapted to balance loading between an external signal source such as the TE, and ICAM 101, may introduce a propagation delay T3 in serial data line 105. The serial data transition time, T1, in first delay circuit 106 may be given by T1>Tp0>T3. The serial data transition time, T2, in second delay circuit 114 may be given by T2>Tp1>T3.

Figure 4:
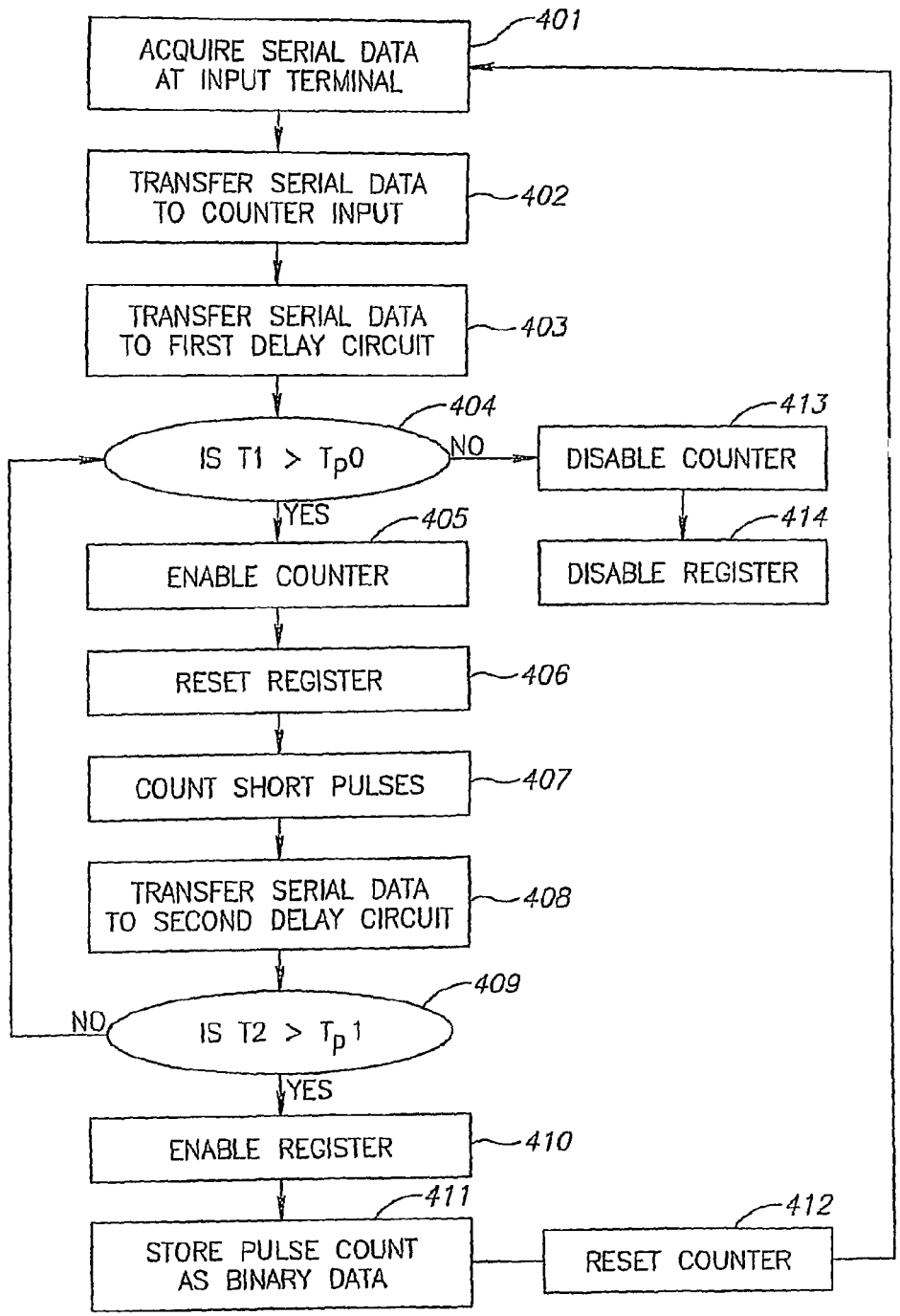
FIG. 4 schematically illustrates a state diagram for the ICAM of FIGS. 1 and 2, in accordance with an embodiment of the invention.

Reference is made to FIG. 4, which schematically illustrates an exemplary state diagram for ICAM 101, in accordance with an embodiment of the invention. Reference is also made to the digital timing diagram shown in FIG. 3.

[STEP 401] Serial data from the external TE is acquired by ICAM 101 through input terminal 102.

[STEP 402] The external serial data is buffered by buffer 104, introducing a time delay (propagation delay) T3 to the external serial data. The delayed signal at the output of buffer 114, internal serial data, is transferred to the input of counter 108.

[STEP 403] Substantially in parallel with the transfer of the internal signal data to the input of counter 108, the internal serial data is also transferred to first delay circuit 106.

[STEP 404] If T1≦Tp0 go to Step 413.

First delay circuit 106 outputs a logical "1" (high) signal after the delay time T1>Tp0>T3, the high signal equal in length to that of the internal serial data. The high signal (enable signal) at the output of first delay circuit 106 is adapted to enable counter 108.

[STEP 405] The enable signal is transferred through Logical AND gate 112 and enables counter 108.

[STEP 406] Substantially in parallel with STEP 404, the enable signal is transferred to inverter 118 which outputs a logical "0" (low) signal. The low signal (reset signal) is adapted to reset register 110.

[STEP 407] Enabled counter 108 counts the leading edges of the pulses in internal serial data at the input to the counter.

[STEP 408] Substantially in parallel with the transfer of the internal signal data to the input of counter 108, the internal serial data is transferred to second delay circuit 114.

[STEP 409] If T2<Tp1 go to STEP 404.

Second delay circuit 114 outputs a logical "1" (high) signal, after the delay time T2>Tp1>T3, which is transferred to first pulse generator 116.

[STEP 410] First pulse generator 116 generates a register enabling signal, P1. Register 110 is enabled on leading edges of P1

[STEP 411] Register 110 stores as binary data the count of leading edges stored in counter 108.

[STEP 412] Substantially in parallel with the enabling of register 110, P1 is transferred to second pulse generator 120. Second pulse generator 120 generates a counter reset signal P2 on a lagging edge of P1, which is transferred to Logical AND gate 112. Logical AND gate 112 resets counter 108; the enable signal output by first delay circuit 106 is present at the input to AND gate 112 when P2 is received from second pulse generator 120. Go to Step 401.

[STEP 413] Disable counter 108.

[STEP 414] Disable register 110.

Figure 5A:
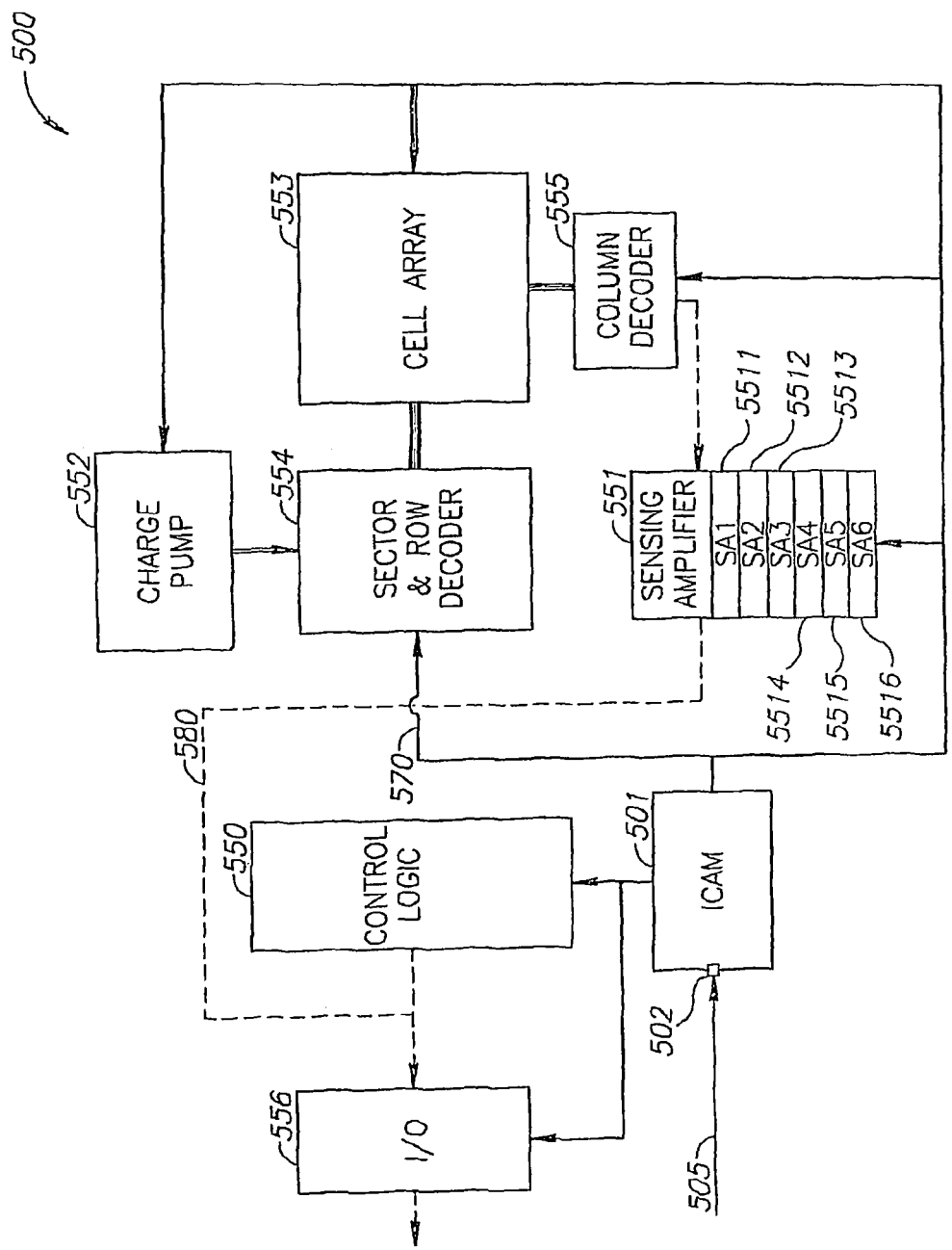
FIGS. 5A and 5B schematically illustrate functional block diagrams of an exemplary non-volatile memory comprising an ICAM, in accordance with some embodiments of the invention.
Figure 5B:
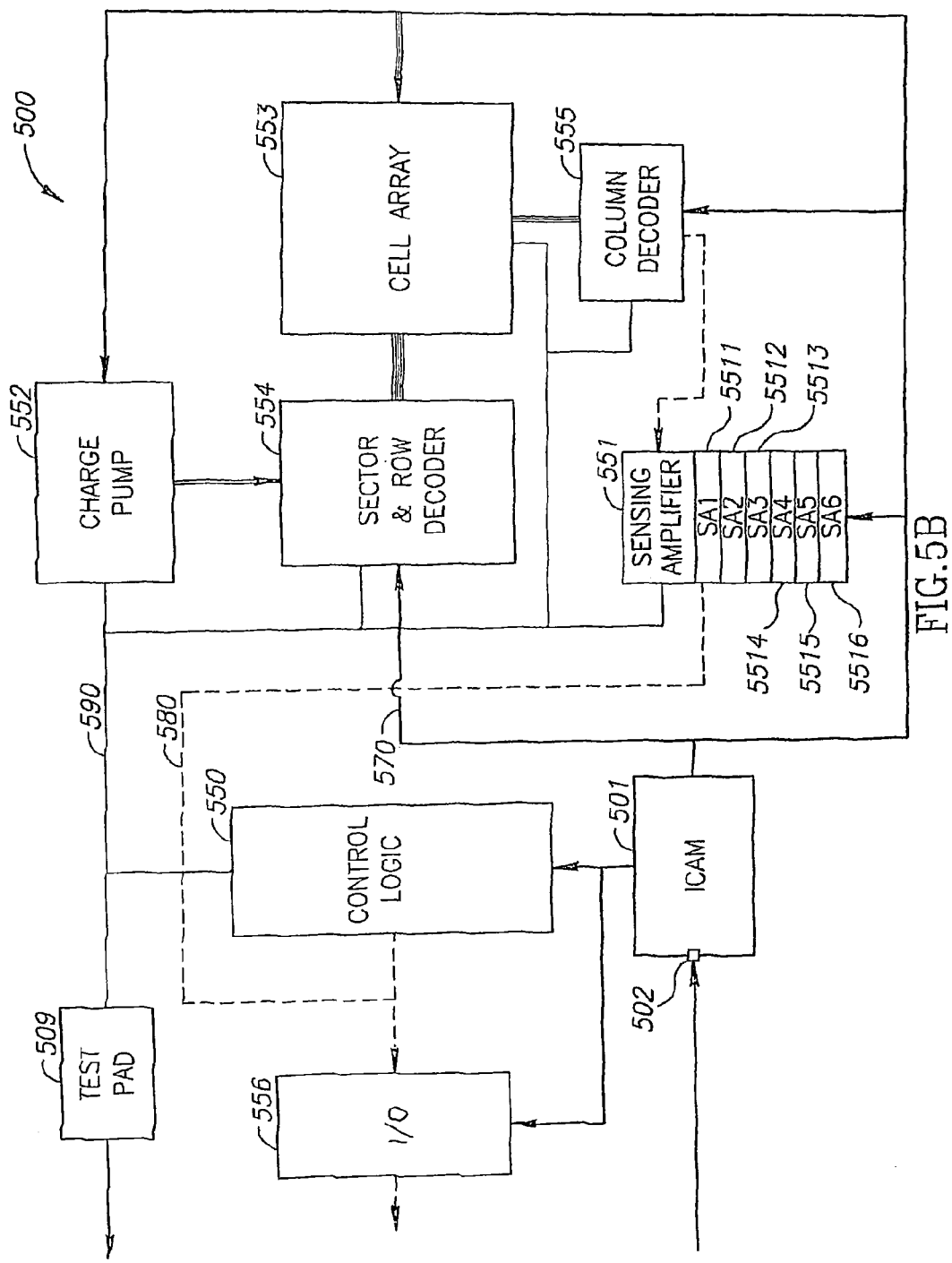

Reference is made to FIGS. 5A and 5B, which schematically illustrate functional block diagrams of an exemplary non-volatile memory 500 (NVM) comprising an ICAM 501, in accordance with some embodiments of the invention. ICAM 501, including input terminal 502, may be the same or substantially similar to that shown in FIG. 1 at 101 and 102. NVM 500 further comprises a primary control circuit (control logic) 550, a sensing amplifier 551, a charge pump 552, a memory cell array 553, a sector/row decoder 554, a column decoder 555, and an input/output interface module 556.

Control logic 550 comprises a primary control circuitry adapted to control a majority of the functional blocks comprised in NVM 500. Control logic 500 is further adapted to decode and execute commands issued by a comprised host processor, including executing algorithms associated with reading, programming (writing) and erasing data in cell array 553. Control logic 500 is also adapted to interface with components and/or devices, externally located with respect to NVM 500, through I/O interface 556. I/O interface 556 is generally adapted to buffer between the functional blocks comprised in NVM 500 and external components and devices. I/O interface 556 is generally further adapted to protect the functional blocks from electrostatic discharge.

Cell array 553 comprises an array of memory cells as known in the art, each cell adapted to store one, or optionally more, bits (for example, two bits). The memory cells may be Floating Gate (FG) flash memory, SONOS (Silicon Oxide Nitride Oxide Semiconductor), TANOS (Tantalum Nitride Oxide Semiconductor), NROM (Nitride Read Only Memory), or other type of memory cells used in NVM.

Sector/row decoder 554 is adapted to enable a sector and a row in memory cell array 553, based on instructions received from control logic 550, so that the memory cells in the enabled sector and row may be read, programmed and/or erased. Column decoder 555 is adapted to enable a column in cell array 553 so that the memory cells in the enabled column may be read, programmed and/or read. Charge pump 552 comprises analog circuitry adapted to generate relatively high voltages for programming and/or erasing the memory cells in cell array 553. Sensing amplifier 551 is adapted to sense relatively low bit voltages and small currents typically associated with reading operations in memory cells, and is further adapted to convert them to levels which may be processed by control logic 550. Sensing amplifier 551 generally comprises a plurality of amplifiers, one amplifier per bit column in cell array 503.

In accordance with some embodiments of the invention, ICAM 501 is adapted to extract data from serial data line 505 into parallel data lines 570. Parallel data lines 570 are associated with address lines to circuit blocks associated with substantially each of the functional blocks comprised in NVM 500, for example, as shown in the figures in sensing amplifier 551 as circuit block SA1 5511, circuit block SA2 5512, circuit block SA3 5513, circuit block SA4 5514, circuit block SA5 5515, and circuit block SA6 5516.

Referring to FIG. 5A, in accordance with some embodiments of the invention, NVM 500 may be configured such that, responsive to the circuit block selected (address call) by ICAM 501, data transferred from the selected circuit block, for example circuit block SA5 5515, go through output data lines 580 to I/O interface 556. Data lines 580 comprises one or more parallel data lines used to transfer data from the functional blocks to I/O interface 556 while NVM 500 is in operation (ICAM 501 is deactivated and control logic 550 is operational). ICAM 501 may partially, or optionally wholly override or bypass control logic 550, while the ICAM makes address calls to the circuit blocks, for example circuit block SA6 5516. The TE may then access the data by connecting to I/O interface 556. Optionally, referring to FIG. 5B, NVM 500 may be configured such that, responsive to the circuit blocks selected by ICAM 501, data transferred from the selected circuit blocks, for example circuit block SA5 5515, go through a dedicated data lines 590 to a test pad 509. Dedicated data lines comprise one or more parallel data lines adapted to transfer data output by circuit blocks in the functional blocks, for example, SA5 5515 in sensing amplifier 551, responsive to an address call from ICAM 501. The TE may then access the data by connecting to test pad 590.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A circuit block access module (ICAM) residing on an integrated circuit and adapted to access a circuit block on said integrated circuit, the module comprising: control logic adapted to extract data from a serial data line into two or more parallel data lines, wherein at least one of the parallel data lines is associated with a circuit block address line; said serial data comprises at least two pulses; and said control logic is further adapted to override or bypass at least a portion of a primary control circuit of said integrated circuit.

2. The ICAM according to claim 1 further comprising at least one pin through which the serial data is input to the integrated circuit.

3. The ICAM according to claim 1 wherein the serial data includes both control signals and data signals.

4. The ICAM according to claim 1 further comprising a counter adapted to count pulses.

5. The ICAM according to claim 4 further comprising a first delay circuit adapted to produce a signal adapted to enable the counter.

6. The ICAM according to claim 5 further comprising a second delay circuit adapted to produce a signal activating a pulse generator.

7. The ICAM according to claim 6 wherein the pulse generator is adapted to produce a signal enabling the register.

8. The ICAM according to claim 4 further comprising a register adapted to store a binary value of a number of counted pulses.

9. A method of accessing a circuit block in an integrated circuit comprising: extracting data from a serial data line including at least two pulses, into two or more parallel data lines, wherein at least one of the parallel data lines is associated with a circuit block address line; and overriding or bypassing at least a portion of a primary control circuit of said integrated circuit.

10. The method of claim 9 further comprising inputting the serial data into the integrated circuit through at least one pin.

11. The method of claim 9 further comprising including both data signals and control signals in the serial data.

12. The method of claim 9 further comprising counting pulses in a counter.

13. The method of claim 12 further comprising producing a delayed signal adapted to enable the counter.

14. The method of claim 13 further comprising producing a delayed signal adapted to initiate a pulse generator.

15. The method of claim 14 further comprising the pulse generator generating a signal adapted to enable the register.

16. The method of claim 12 further comprising storing a binary value of a number of counted pulses in a register.

17. An integrated circuit device comprising: at least one circuit block selected from the group consisting of an NVM array segment, a charge pump circuit, a sense amplifier circuit, a decoder circuit, an encoder circuit and a logic circuit; a primary control circuit; and a circuit block access module (ICAM) adapted to access a circuit block on said integrated circuit, the module comprising control logic adapted to extract data from a serial data line into two or more parallel data lines, wherein at least one of the parallel data lines is associated with a circuit block address line; and the control logic is further adapted to override or bypass at least a portion of a primary control circuit of said integrated circuit.

18. The integrated circuit device of claim 17 wherein the at least one circuit block produces a data output (data accessed) responsive to ICAM access.

19. The integrated circuit device of claim 18 further comprising a test pad for accessing the data output.

20. The apparatus of claim 19 wherein the integrated circuit device is a non-volatile memory.

21. An apparatus comprising an integrated circuit device, the integrated circuit device comprising: at least one circuit block selected from the group consisting of an NVM array segment, a charge pump circuit, a sense amplifier circuit, a decoder circuit, an encoder circuit and a logic circuit; a primary control circuit; and a circuit block access module (ICAM) adapted to access a circuit block on said integrated circuit, the module comprising control logic adapted to extract data from a serial data line into two or more parallel data lines, wherein at least one of the parallel data lines is associated with a circuit block address line; and the control logic is further adapted to override or bypass at least a portion of a primary control circuit of said integrated circuit.

22. A non-volatile memory ("NVM") device comprising: at least one circuit block selected from the group consisting of an NVM array segment, a charge pump circuit, a sense amplifier circuit, a decoder circuit, an encoder circuit and a logic circuit; a primary control circuit; and a circuit block access module (ICAM) adapted to access a circuit block on said integrated circuit, the module comprising control logic adapted to extract data from a serial data line into two or more parallel data lines, wherein at least one of the parallel data lines is associated with a circuit block address line; and the control logic is further adapted to override or bypass at least a portion of a primary control circuit of said integrated circuit.

23. The non-volatile memory device of claim 22 wherein the at least one circuit block produces a data output (data accessed) responsive to ICAM access.

24. The non-volatile memory device of claim 23 further comprising a test pad for accessing the data output.

25. The device according to claim 22, wherein said ICAM is adapted to activate or deactivate a circuit block.

26. The device, according to claim 22, wherein said ICAM is adapted to connect or disconnect a circuit block from a data line of the device.

27. The device according to claim 22, wherein said ICAM is adapted to configure, initiate or otherwise interact with a circuit block.

* * * * *